Oct. 6, 1970 W. E. ENGELER ETAL 3,533,022

MAGNETICALLY DRIVEN ELECTROMECHANICAL FILTER WITH CANTILEVERED RESONATOR AND VARIABLE Q

Filed Aug. 11, 1967

Inventors:
William E. Engeler,
Marvin Garfinkel,
by Marvin Snyder
Their Attorney.

United States Patent Office 3,533,022
Patented Oct. 6, 1970

3,533,022
MAGNETICALLY DRIVEN ELECTROMECHANICAL FILTER WITH CANTILEVERED RESONATOR AND VARIABLE Q

William E. Engeler, Scotia, and Marvin Garfinkel, Schenectady, N.Y., assignors to General Electric Company, a corporation of New York Filed Aug. 11, 1967, Ser. No. 660,077
Int. Cl. H03h 7/10, 9/24
U.S. Cl. 333—71 24 Claims

ABSTRACT OF THE DISCLOSURE

A magnetically driven electromechanical filter including a cantilevered resonator, the plane of which is situated substantially parallel to a constant magnetic field. The resonator is constrained so that its free end can move only in a direction substantially normal to the magnetic field. A bifilar piezoresistive region in the resonator senses strain without distortion due to an induced signal. A metallic conductor on the resonator functions as a generator which may be connected either to subsequent resonators so as to form a bandpass filter or to a variable shunt resistor which thereupon acts as a Q adjuster. The filter may be produced as either a monolithic or discrete device.

BACKGROUND OF THE INVENTION

This invention relates to filters and more particularly to a magnetically driven electromechanical filter utilizing a resonator such as a cantilevered resonator and having facility for varying Q thereof.

Electromechanical filters or resonators have generally been made of crystalline quartz cut so as to mechanically resonate when electrically driven at a mechanical resonance frequency. Although the figure of merit commonly designated Q, which represents a number proportional to the ratio of average energy stored to energy dissipated per cycle, is quite high for such resonators, they possess the disadvantages of being expensive, due to the high cost of crystalline quartz and its poor machinability. Devices of this type are also quite large and require special mounting. Moreover, the output of a quartz resonator or that of any other piezoelectric device loads the input. Furthermore, the value of Q for such filters cannot be adjusted independently of the output signal by varying circuit parameters.

More recently, two other types of electromechanical filters have appeared. One type comprises a small metal flexor mounted on top of a silicon wafer and positioned above the gate region of a field effect transistor so as to act as the gate electrode. The flexor beam is capacitively driven from the substrate, and its motion modulates a voltage at the gate of the field effect transistor in order to modulate the field effect transistor output signal. However, this device suffers from the defect that the signal is nonlinear.

The second type of electromechanical filter which has recently appeared utilizes a flexing beam of silicon which is mounted on a substrate. The output of this device is piezoresistive, and is thus linear. The drive mechanism is thermal in that resistively generated heat expands appropriately chosen sections of the beam and, if the frequency is proper, the beam can be made to resonate. This second device is limited in operation to low frequencies.

In our copending application, Ser. No. 660,078 filed concurrently herewith and assigned to the instant assignee, we describe and claim an electromechanical filter formed in monolithic silicon and compatible with integrated circuitry. The entire filter, including the resonator member, is formed of a single crystal semiconductor and may be fabricated on a common chip with associated integrated circuitry. In our copending application Ser. No. 660,076 filed concurrently herewith and assigned to the instant assignee, we describe and claim a discrete electromechanical filter having a resonator beam which is driven in the flexural mode by interaction of a constant magnetic field with AC current through a metallic layer overlying the beam. The resonator beam is alloy bonded to opposite sides of a cavity formed in a semiconductor or ceramic base.

By use of the instant invention, large amplitude output signals may be obtained from a resonator, such as a cantilevered resonator, driven by interaction of a constant magnetic field with an AC driving current flowing on the resonator in a direction substantially perpendicular to the field. The resonator is comprised of a monocrystalline semiconductor, such as silicon. Moreover, by adding a metallic conductor essentially parallel to the path of the driving current, it is possible to achieve either by an adjustable Q filter or a wide bandpass filter. The added metallic conductor oscillates in the magnetic field so as to generate a voltage. By terminating this conductor in a resistance, permitting current to flow through the conductor, loading of the resonant structure results. This changes the value of Q of the filter, allowing it to be adjusted to a desired value.

Output transducer means comprising a strain sensitive resistive element are integrally included for sensing strain in the resonator and producing an output signal. Since the output signal is linear in resonator strain, there is no harmonic generation by the filter. The resistive element is so shaped and situated in the resonator as not to utilize the mechanical energy of the resonator for inducing an output signal, but rather to utilize a source of DC current included within its circuit so that the output of this resistor does not influence the value of Q of the filter.

The range of frequencies available by suitable choice of resonator geometry, mode of oscillation, and excited harmonic is very wide, ranging from $10^3$ Hz.–$10^9$ Hz. and thereby including both audio and video intermediate frequencies. Furthermore, the output circuitry is completely decoupled from the input and does not load the input circuitry at all; also, the output signal may be supplied at almost any impedance level desired. Because the output transducing means are integral with the oscillating member, all signal attenuation due to losses at resonator-transducer interfaces is eliminated.

The electromechanical filter of the instant invention, which may be fabricated in either discrete or monolithic form, is driven by an alternating current supplied to the mechanical resonator of the electromechanical filter in the presence of a magnetic field created either by a permanent magnet or by electromagnetic means. The alternating current furnished to the resonator does very little, unless the frequency of alternation falls within the passband of the mechanical resonator. When the input frequency of the alternating current does fall within the resonator passband, a mechanical oscillation of the resonator builds up, with amplitude dependent upon input power and upon Q of the resonator. The resonant member, which thereupon resonates, has mechanically resonant frequencies determined by its geometrical shape and the elastic properties of the material of which it is comprised.

The electrical output signal may be obtained from a piezoresistive region or resistor diffused into a surface of the resonator in the manner described in our aforementioned copending applications Ser. Nos. 660,076 and 660,078. Placement and shape of the diffused resistor are selected to maximize the output signal and minimize any induced voltage therein so that, as the resonator oscillates, resistance of the diffused resistor changes, producing an electrical output signal proportional to amplitude of strain in the resistor. Since strain in the diffused resistor thus varies sinusoidally with time, an AC output signal is obtained. For a cantilevered resonator, this signal may be maximized by situating the resistor close to the supported end of the resonator, i.e. the flexing region thereof, and by selecting proper orientation of the resistor with respect to both the crystallographic axis of the semiconductor and the orientation of the resonator. Thus, the longitudinal axis of the resistor should be directed between the supported and free ends of the resonator, which is the direction of maximum uniaxial strain, and also should be along a <111> direction in case of a P-type output resistor and along a <100> direction for an N-type resistor, resulting in gauge factors for low concentrations of impurities of approximately 180 and 130 respectively; that is, the direction of maximum uniaxial strain and the diffused resistor should both be along a <111> direction in the case of a P-type output resistor and a <100> direction in the case of an N-type output resistor. "Gauge factor," as used herein, may be defined as the ratio of the net fractional change in resistivity of the diffused resistor utilized as a sensor, caused by uniform strain in the flexor member, to the uniform strain of the flexor member.

Electromechanical resonators of the instant invention may be coupled together in cascaded fashion by utilizing the aforementioned added conductor. Thus, a first resonator can be made to drive a second resonator, and so on. This produces an electrically coupled compound resonator which functions as a bandpass filter having a wide passband. The extent of the electrical coupling may be adjusted by adjusting the impedance of the coupling circuits. Moreover, the filters of the instant invention may be so coupled regardless of whether they are fabricated in discrete or monolithic form.

BRIEF SUMMARY OF THE INVENTION

Briefly, in accordance with a preferred embodiment of the invention, an electromechanical filter is provided comprising a rigid walled structure defining a cavity therein, with the structure being situated in a magnetic field and with cantilevered resonator means joined to a wall of the structure. Insulator means are adhered to the resonator means, and current conducting means responsive to input signals are adhered to the insulator means, with at least part of the current conducting means being oriented substantially normal to the direction of the magnetic field. Piezoresistive output means integral with resonator means and responsive to motion of the resonator means are provided for producing a signal of amplitude and frequency proportional respectively to the amplitude and frequency of oscillation of the resonator means.

In another preferred embodiment of the invention, an electromechanical filter with adjustable Q is provided comprising a rigid walled structure defining a cavity therein, with the structure being situated in a magnetic field and with resonator means joined to a wall of the structure. Insulator means are adhered to the resonator means, and first and second current conducting means are adhered to the insulator means, with at least part of the first and second current conducting means being oriented substantially normal to the direction of the magnetic field. Input signals are furnished to the first current conducting means, and circuit means are connected across the second current conducting means for the purpose of controllably dissipating energy so as to control the value of Q of the filter. Piezoresistive output means integral with the resonator means and responsive to motion of the resonator means are provided for producing a signal of amplitude and frequency proportional respectively to the amplitude and frequency of oscillation of the resonator means.

In still another preferred embodiment of the invention, an electromechanical bandpass filter is provided comprising a plurality of mechanical resonators situated in a magnetic field. Insulator means are adhered to each of the respective resonators, and first and second current conducting means are adhered to each of the insulator means respectively, with at least a portion of each of the first and second current conducting means respectively being oriented substantially normal to the direction of the magnetic field. Input signals are furnished to the first current conducting means of a first of the resonators. Circuit means are provided for electrically coupling the resonators by interconnecting the second current conducting means of each resonator except a single resonator to the first current conducting means of another resonator respectively. Piezoresistive output means integral with at least a predetermined one of the interconnected resonators and responsive to motion of the predetermined one of the interconnected resonators are provided for producing a signal of amplitude and frequency proportional to the amplitude and frequency of oscillation of the predetermined one of the interconnected resonators.

Accordingly, one object is to provide an electromechanical filter with a cantilevered mechanical resonator beam having an output signal which is linear in cantilever beam strain so as to avoid harmonic generation by the filter.

Another object is to provide an electromechanical filter wherein the output circuitry does not load the input circuitry.

Another object is to provide a magnetically driven electromechanical filter having a selectable frequency range and output impedance level, and a Q level which may be varied over a wide range of values.

Another object is to provide an electromechanical filter with a cantilevered resonator which may be fabricated as a discrete device or as part of an integrated circuit.

Another object is to provide a bandpass filter having a plurality of electrically coupled mechanical resonators.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF THE PREFERRED EMBODIMENTS

Figures 1, 2, 4:
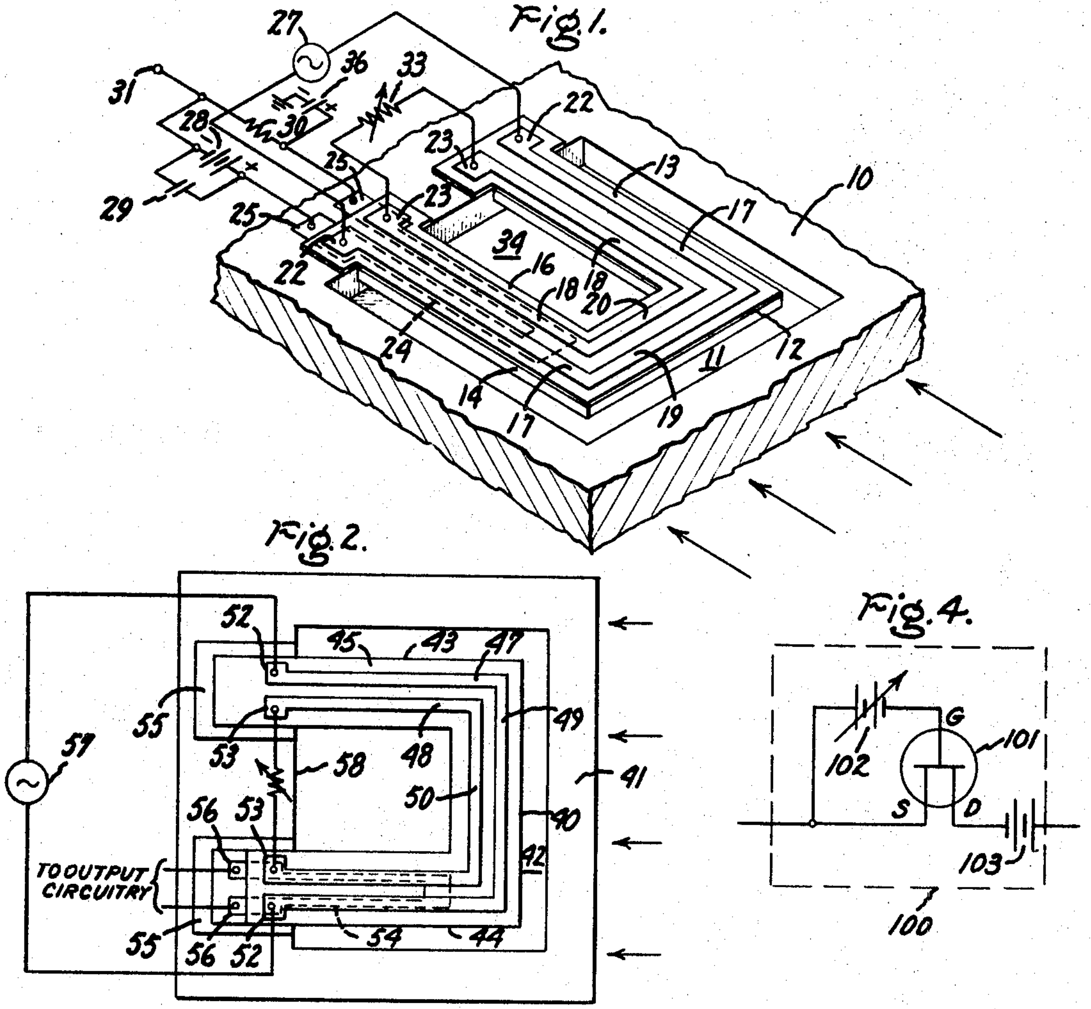
FIG. 1 is an isometric view of an electromechanical filter of the instant invention as fabricated by integrated circuit techniques, illustrating circuit means for adjusting Q of the filter.
FIG. 2 is a plan view of the electromechanical filter of the instant invention fabricated in the form of a discrete device, illustrating circuit means for adjusting Q of the filter.
FIG. 4 is a schematic diagram of alternate circuit means for electrically coupling the resonator means of the filter shown in FIG. 3 and for controlling Q of the filters illustrated in FIGS. 1–3.

In FIG. 1, a monocrystalline semiconductor body 10 is shown having a cavity 11 therein with a resonator 12, including flexing regions 13 and 14, suspended over the cavity in cantilever fashion. Resonator 12 may have its interior region 34 removed as shown, as so to reduce the stiffness thereof. The single electromechanical filter shown in FIG. 1 is compatible with monolithic integrated circuitry, which may be formed on the crystal, and one or more such filters may be incorporated in an integrated circuit. The constant magnetic field has no appreciable effect on the elements of the integrated circuit.

Resonator 12 is coated with a layer of insulation 16 adherent thereto. If the semiconductor utilized is silicon, then layer 16 preferably comprises an oxide of silicon, such as silicon dioxide. A pair of metallic strips 17 and 18, which may comprise molybdenum or aluminum for example, are overlaid upon insulation layer 16 and comprise input and coupling paths respectively. Strips 17 and 18 each have a portion 19 and 20 respectively, which is directed along resonator 12 so as to be substantially perpendicular to a fixed magnetic field, indicated by the arrows, passing through the plane of the structure parallel thereto. Input strip 19 is thus oriented so that force exerted on its current by the magnetic field is perpendicular to the plane of the resonator enabling the resonator to be driven in its flexural mode. This strip is located close to the unconstrained end so as to maximize the electromechanical coupling. Generator strip 20 is also similarly oriented and located so as to maximize voltage induced by the mechanical motion of the resonator oscillating in the magnetic field. Although resonator 12 might comprise a conductive path, parasitic induced currents therein are avoided by use of a semiconductive resonator material of judiciously selected high resistivity or by forming a P-N junction completely through the bulk of the material of resonator 12. Pads 22 and 23 provide terminals for strips 17 and 18; alternatively, metallic strips 17 and 18 may be extended over crystal 10 to other regions of an integrated circuit formed thereon.

A U-shaped piezoresistive region 24 with low resistance pads 25 for connection thereto is diffused into flexing region 14 and over the supported end of resonator beam 12, which is the region of maximum strain, for the purpose of responding to strain resulting from oscillation of the beam. This region, which is of conductivity type opposite to that of the portion of crystal 10 into which it is diffused, is directed generally parallel to the direction of the magnetic field and is bifilar so as to preclude inducing appreciable voltages therein. The bottom of the U formed by region 24 is either wider or diffused deeper than the sides of the U, so that the strain sensitive regions are essentially comprised only of the sides of the U. Hence, changes in resistance as measured at pads 25 are due substantially entirely to changes in strain in flexing region 14 of resonator 12. Tabs 25 may be connected to external leads, including a source of direct current in series therewith, in order to measure resistance of region 24; alternatively, tabs 25 may be diffused into crystal 10 in such manner as to extend to some other part of the integrated circuitry associated therewith on the crystal. It should also be noted that a diffused U-shaped region may, if desired, be formed in flexing region 13 in order to respond to changes in strain in flexing region 13. Flexing regions 13 and 14 are oriented with their lengths along a <100> crystallographic axis, assuming crystal 10 to be of P-type conductivity and piezoresistive region 24, assumed to be of N-type conductivity, is diffused along the <100> axis of region 14 in order to maximize the gauge factor; if crystal 10 were of N-type conductivity however, flexing regions 13 and 14 would be oriented with their lengths along a <111> crystallographic axis and P-type piezoresistive region 24 would be diffused along the <111> crystallographic axis of region 14.

If an AC signal is supplied to tabs 22 from an AC source 27, the current through conductor 19 interacts with the magnetic field to produce a force acting on resonator 12 in a direction substantially perpendicular to the plane of the resonator. This force reverses direction with each reversal of current through conductor 19 of path 17 at a frequency equal to the frequency of AC signal source 27, thus establishing vibrations of resonator 12 which, at a resonant frequency of the system, exhibit large displacement amplitudes. These oscillations in turn establish large amplitude strains in flexing region 14 which are sensed by piezoresistive diffused region 24. Thus, the resistance of region 24 increases and decreases at a frequency equal to that of AC signal source 27. This alternation of resistance value may be sensed at tabs 25 by connecting a DC source 28 shunted by a bypass capacitor 29 in series with a resistance 30 across tabs 25. The AC output voltage, representative of amplitude and frequency of strain in beam 14, may be measured across resistance 30 at an output terminal 31. Since the output signal is dependent on the amplitude and frequency of strain in flexing region 14, it is also dependent on the amplitude and frequency of oscillation of flexing region 14 which, in turn, is dependent on the amplitude and frequency of oscillation of resonator 12. To maintain high impedance across the junction between piezoresistive region 24 and crystal 10, a reverse bias is applied thereacross from a DC source 36 with polarity as illustrated, assuming a P-type crystal and N-type piezoresistive region.

By connecting a variable resistance 33 across tabs 23, the Q of the filter may be controlled. If resistance 33 is made sufficiently large, so as to be substantially infinite in resistance, then a voltage generated across tabs 23 due to oscillatory motion of strip 20 in the magnetic field produces essentially no current; hence, oscillatory vibration of resonator 12 remains undamped. However, as resistance 33 is decreased in ohmic value, the AC voltage generated across generator strip 20 results in an increasing current flow through resistance 33. Energy is thus dissipated as heat in resistance 33, increasing the amount of energy dissipated per cycle. This has the effect of lowering Q, resulting in a less sharply tuned filter. Conversely, if resistance 33 should be increased, energy dissipation therein decreases, resulting in a higher value of Q and thus a more sharply tuned filter. In this manner, resistance 33 provides the facility of controlling the value of Q for the filter. Those skilled in the art will recognize that resistance 33 could comprise a circuit element of an associated integrated circuit such as, for example, the source-drain resistance of a field effect transistor, which would be variable by controlling gate voltage.

The structure of FIG. 1 may be fabricated by the method described and claimed in our copending application Ser. No. 660,078. Briefly, this method involves deposition of a silicon nitride slab on a silicon crystal of one type conductivity, such as P-type, and thereafter epitaxially growing additional silicon of the same P-type conductivity over the silicon nitride slab so as to completely bury the slab within the enlarged crystal. The thickness of the epitaxially-grown region is made equal to the thickness of resonator 12 and flexing members 13 and 14, while the thickness of the silicon nitride slab is made equal to the desired distance between the original silicon, which forms the bottom of cavity 11, and the bottom of the resonator. Piezoresistive region 24 is then formed in flexing region 14 of conductivity type opposite to that of the crystal by diffusing donor impurities therein. Thereafter, silicon monoxide layer 16 is formed over the area to comprise resonator 12, and metallic strips 17 and 18, such as molybdenum, are deposited as by sputtering or evaporating onto silicon monoxide layer 16. A layer of silicon nitride is applied over the region to become the resonator, and the silicon is etched so as to form resonator 12, including aperture 34 therein if desired. The silicon nitride slab is thereafter etched out to leave cavity 11. Alternatively, strips 17 and 18 may be applied to resonator 12 following its formation and etching of cavity 11 by evaporation. These strips may comprise aluminum, molybdenum, or combinations of chromium with copper, silver or gold superimposed thereon. Ohmic contact may be made to regions 25 by metallization or thermocompression bonding, for example. These electromechanical filters together with any desired integrated circuitry may be fabricated simultaneously on a single crystal.

The structure of FIG. 2 is a second embodiment of the invention wherein a resonator 40 bonded to a base 41, which may be comprised of a monocrystalline or polycrystalline semiconductor wafer, or a ceramic, is suspended in cantilever fashion over a cavity 42 in the base. For illustrative purposes, the material of base 41 is herein assumed to be a ceramic, such as aluminum oxide or a mixture of aluminum oxide and silicon dioxide, commonly known as mullite, whose thermal expansion is similar to that of silicon over the temperature range employed in fabrication of the filter. Mullite may be purchased from McDanel Refractory Porcelain Company, Beaver Falls, Pennsylvania. Resonator 40, which preferably has its interior portion on the inner sides of flexing regions 43 and 44 removed in order to increase compliance, is coated with a layer of insulation 45. If the semiconductor utilized is silicon, then layer 45 preferably comprises an oxide of silicon such as silicon dioxide, which may be formed thereon by oxidation of the silicon. A pair of metallic strips 47 and 48, which may comprise molybdenum or aluminum or combinations of chromium with copper, silver or gold superimposed thereon for example, are overlaid upon insulation layer 45 and comprise input and coupling paths respectively. Each of strips 47 and 48 includes a portion 49 and 50 respectively which is directed along resonator beam 40 so as to be substantially perpendicular to a fixed magnetic field as indicated by the arrows. The plane of the structure is situated parallel to the field. Tabs 52 and 53 provide terminals for strips 47 and 48; alternatively, metallic strips 47 and 48 may be extended outward over structure 41 for connection to associated circuitry.

Flexing regions 43 and 44 are integral with resonator 40, which comprises a single silicon crystal, and are bonded at their free ends to the upper surfaces of a wall of base 41 through metallized regions 55. If the resonator is of P-type conductivity, as will be assumed herein for illustrative purposes, flexing regions 43 and 44 are oriented with their lengths along a <100> crystallographic axis and an N-type resistor, comprising a U-shaped piezoresistive region 54, is therefore diffused along the <100> axis of region 44 in order to maximize the gauge factor; if the resonator were of N-type conductivity however, the support regions would be oriented with their lengths along a <111> crystallographic axis and a P-type resistor would be diffused along the <111> axis of region 44 for the same reasons. U-shaped piezoresistive strain sensing region 54 is diffused into the upper surface of flexing member 44 with widened areas 56 on either side thereof for purposes of making low resistance contact to U-shaped region 54. U-shaped region 54 is directed generally parallel to the direction of the magnetic field, indicated by the arrows, and is bifilar so as to preclude inducing appreciable voltages therein, and is located in region 44 so as to be sensitive to maximum strain in resonator 40. The bottom of the U formed by region 54 is either wider or diffused deeper than the sides of the U, so that the strain sensitive regions are essentially comprised only of the sides of the U. Hence, changes in resistance as measured at tabs 56 are due substantially entirely to changes in strain in flexing region 44 of resonator 40. Tabs 56 may be connected to external leads, including a source of direct current in series therewith, in order to measure resistance of region 54. It should also be noted that a diffused U-shaped region may, if desired, be formed in flexing region 43 in order to respond to changes in strain in flexing region 43.

If an AC signal is supplied to tabs 52 from an AC source 57, the current through conductor 49 interacts with the magnetic field to produce a force acting on resonator 40 in a direction substantially perpendicular to the plane of the resonator. This force reverses direction with each reversal of current through conductor 49 of path 47 at a frequency equal to the frequency of AC signal source 57, thus establishing vibrations of resonator 40 which, at a resonant frequency of the system, exhibit large displacement amplitudes. These oscillations in turn establish large amplitude strains in flexing region 44 which are sensed by piezoresistive diffused region 54. Thus, the resistance of region 54 increases and decreases at a frequency equal to that of AC signal source 57. This alternation of resistance value may be sensed at tabs 56 in a manner similar to that described for the apparatus of FIG. 1 by connecting the tabs to output circuitry similar to that connected to tabs 25 of the device of FIG. 1. Moreover, by connecting a variable resistance 58 across tabs 53, the Q of the filter may be controlled in the manner described in conjunction with the apparatus of FIG. 1, so as to either sharply tune the filter, by setting resistance 58 at a high ohmic value, or to broaden the pass band of the filter by lowering the ohmic value of resistance 58 so as to dissipate a greater amount of energy therein.

Flexing regions 44 and 45 are attached to ceramic base 41, which is preferably comprised of mullite or aluminum oxide, by the method set forth in our copending application Ser. No. 660,076. Briefly, this method comprises coating molybdenum trioxide onto the ceramic of base 41 in the desired regions 55, heating base 41 in a hydrogen atmosphere to 1300° C., and melting silver containing approximately 10% tin at 810° C. so as to alloy to the fired molybdenum trioxide. Resonator 40 is positioned so as to extend over cavity 42 and is likewise alloyed with the same silver-tin metallizing material by heating this material thereon in a hydrogen atmosphere to about 750° C. in order to provide strong bonds between each of support regions 44 and 45 and metallized regions 55. If base 41 should be a semiconductor, such as silicon, the process for bonding resonator 40 to base 41 is identical to that described for the ceramic base, except that molybdenum trioxide is not applied at all, and the step of melting the silver-tin alloy at 810° C. so as to alloy to the molybdenum trioxide is also omitted.

Figure 3:
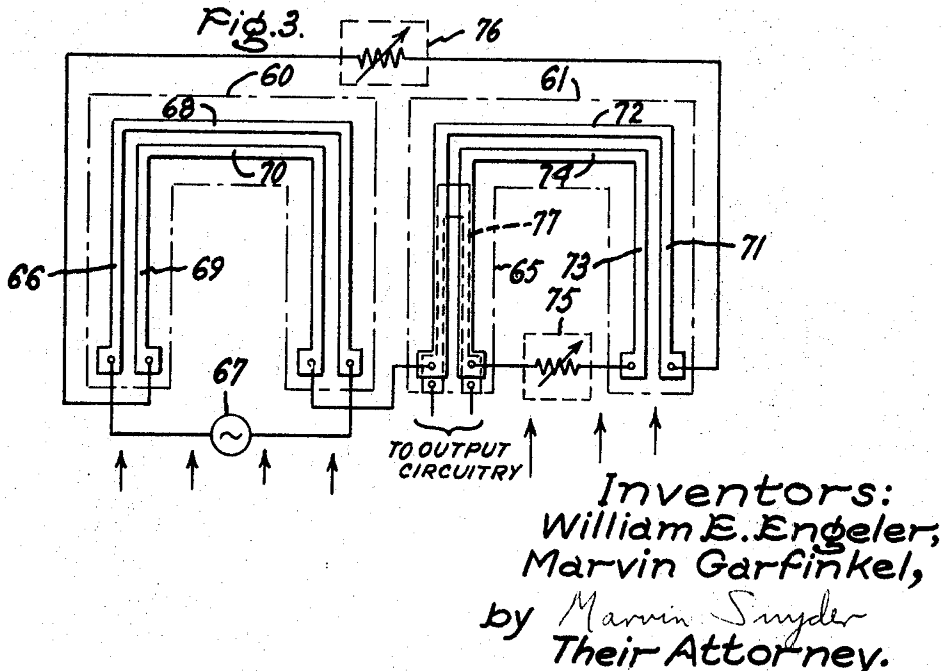
FIG. 3 is a schematic diagram of a bandpass filter comprising electrically coupled resonator means.

FIG. 3 is a schematic diagram illustrating how the resonators of two or more filters of the instant invention may be electrically interconnected to form a bandpass filter. The resonators may be those of monolithic filters, such as shown in FIG. 1, or discrete filters, such as shown in FIG. 2. Moreover, the resonators may all be formed on a single base if desired. For purposes of clarity, resonators 60 and 61 are indicated by dot-dash boundaries, and insulation between the metallic conducting paths and the silicon of the resonators is also omitted.

In the diagram, resonators 60 and 61 are situated, as previously described, in a magnetic field indicated by the arrows. An input conducting path 66 on resonator 60 receives an input signal from an input signal source 67. A portion 68 of the input signal path is directed substantially perpendicularly to the magnetic field. A second conducting path 69 is similarly situated on resonator 60 with a region 70 directed substantially perpendicularly to the magnetic field, so that motion of resonator 60 in a direction substantially normal to the magnetic field induces a voltage across region 70.

An input conducting path 71 is situated on resonator 61 with a portion 72 directed substantially perpendicularly to the plane of the magnetic field. A second conducting path 73 is similarly situated on resonator 61 with a portion 74 directed substantially perpendicularly to the plane of the magnetic field, so that motion of resonator 61 in a direction susbtantially normal to the magnetic field induces a voltage across region 74. A variable resistance 75 is connected across conducting path 73 for the purpose of adjusting the value of Q of the bandpass filter.

Electrical coupling between resonators 60 and 61 is achieved by connecting generator strip 70 in series with input path 71 through circuit means 76 shown as a resistance which may be made variable to adjust the amount of electrical coupling between the resonators. Resistance 76 might conveniently comprise the source-drain resistance of a field-effect transistor whose resistance is varied by varying the gate voltage. Output signals are derived through output circuitry, such as illustrated in FIG. 1, from a piezoresistive region 77 diffused into flexing region 65 of the resonator 61 and insulated from current paths 71 and 73 as previously described in conjunction with the apparatus of FIGS. 1 and 2. Those skilled in the art will recognize that generator strip 74 may be coupled through circuit means, similar to circuit means 76, to a subsequent input path on a subsequent resonator in place of resistance 75, and that a similar resistance may be connected across a second conducting path on the third resonator, etc.

In operation, current from AC signal source 67 flows through input strip 68 in a direction substantially perpendicular to the magnetic field, therefore exerting a force perpendicular to the plane of the resonator in either direction, depending upon the direction of current from source 67. Hence, as current from source 67 reverses direction, the force exerted on resonator 60 also reverses its direction, displacing the resonator in the reverse direction. The motion of resonator 60 induces an AC voltage in generator strip 70, causing alternating current to flow through resistance 76 and input path 71 on resonator 61. The frequency of this current is equal to that of source 67, and the amplitude thereof is controlled essentially by the ohmic value of resistance 76 and the voltages induced in generator strips 70 and 74 due to the motion of resonators 60 and 61 respectively. This current in turn causes forces to be exerted upon resonators 60 and 61, thereby effectuating the motion of resonator 61, and hence affecting the motion of resonator 60. In this manner the mechanical motions of resonators 60 and 61 are coupled together electrically to form a bandpass filter.

The motion of resonator 61 causes a voltage to be induced in generator strip 74 and hence current to flow through resistance 75. This current couples out mechanical energy from the filter and dissipates it in resistance 75 in the form of heat. Thus the ohmic value of resistance 75 controls the value of Q of the bandpass filter. This method of electrically cascading mechanical resonators results in a filter with a pass band which may be made progressively wider as resonators are added to the filter. Output signals are supplied to output circuitry, such as disclosed in FIG. 1, from bifilar piezoresistive regions, such as region 77, diffused into flexing regions of the bandpass filter.

FIG. 4 illustrates circuit means 100 which may be substituted for either or both of circuit means 75 and 76 of FIG. 3, as well as for resistance 58 in the circuit of FIG. 2 or resistance 33 in the circuit of FIG. 1. It is well-known that field-effect transistors may be operated as resistances which are essentially linear and are linearly variable over a wide range of resistance. Thus, circuit means 100 comprises a field-effect transistor 101 having gate, source and drain electrodes indicated by the letters G, S and D respectively. A variable voltage supply 102 is connected so as to bias the gate electrode with respect to the source electrode, while a bias voltage 103 is connected in series with the drain electrode in order to provide source-drain bias voltage. The variable resistance of circuit means 100 thus comprises substantially the resistance which appears across the source and drain electrodes of transistor 101, and is variable in accordance with the amplitude of voltage produced by voltage source 102.

The foregoing describes an electromechanical filter having a cantilevered mechanical resonator generating a voltage which can be used either to control Q of the filter or to enable employment of coupling means for interconnecting several such mechanical resonators so as to form a bandpass filter. The filter, which is magnetically driven, has a selectable frequency range and output impedance level, and a Q level which may be varied over a wide range of values, with the output circuitry being completely decoupled from the input circuitry. The filter may be fabricated as a discrete device or may be incorporated into an integrated circuit.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. An electromechanical filter comprising: a rigid walled structure defining a cavity therein, said structure being situated in a magnetic field; cantilevered resonator means joined to a wall of said structure; insulator means adherent to the resonator means; current conducting means adherent to said insulator means with at least a portion of said current conducting means oriented substantially normal to the direction of said magnetic field; and piezoresistive output means integral with said resonator means and responsive to motion of said resonator means for producing a signal of amplitude and frequency proportional respectively to the amplitude and frequency of oscillation of said resonator means.

2. The electromechanical filter of claim 1 including second current conducting means adherent to said insulator means, with at least part of said second current conducting means being situated substantially normal to the direction of said magnetic field.

3. The electromechanical filter of claim 2 including circuit means connected across said second current conducting means for lowering the value of Q of said filter.

4. The electromechanical filter of claim 3 wherein said circuit means comprises a resistance.

5. The electromechanical filter of claim 4 wherein said resistance means are variable.

6. The electromechanical filter of claim 3 wherein said circuit means comprises a field-effect transistor.

7. The electromechanical filter of claim 1 wherein said cantilevered resonator means includes an aperture therein bounded by flexing regions on either side of said aperture, said piezoresistive output means being diffused into at least one of said flexing regions.

8. The electromechanical filter of claim 7 wherein the longitudinal axis of at least one flexing region is substantial coaxial with the direction of said magnetic field.

9. An electromechanical filter comprising: a rigid walled structure defining a cavity therein, said structure being situated in a magnetic field; resonator means joined to a wall of said structure; insulator means adherent to the resonator means; first and second current conducting means adherent to said insulator means with at least a portion of said first and second current conducting means oriented substantially normal to the direction of said magnetic field; and piezoresistive output means integral with said resonator means and responsive to motion of said resonator means for producing a signal of amplitude and frequency proportional respectively to the amplitude and frequency of oscillation of said resonator means.

10. The electromechanical filter of claim 9 including circuit means connected across said second current conducting means for controlling the value of Q of said filter.

11. The electromechanical filter of claim 10 wherein said circuit means comprises a resistance.

12. The electromechanical filter of claim 11 wherein said resistance means are variable.

13. The electromechanical filter of claim 10 wherein said circuit means comprises a field-effect transistor.

14. An electromechanical bandpass filter comprising: a plurality of mechanical resonators situated in a magnetic field; insulator means adherent to each of the respective resonators; first and second current conducting means adherent to each of said insulator means respectively with at least a portion of each of said first and second current conducting means respectively being oriented substantially normal to the direction of said magnetic field; circuit means electrically coupling said resonators by interconnecting the second current conducting means of each resonator except a single resonator to the first current conducting means of another resonator respectively; and piezoresistive output means integral with at least a predetermined one of said interconnected resonators and responsive to motion of the predetermined one of the interconnected resonators for producing a signal of amplitude and frequency proportional to the amplitude and frequency of oscillation of the predetermined one of said interconnected resonators.

15. The electromechanical bandpass filter of claim 14 wherein each of said circuit means comprises a resistance.

16. The electromechanical bandpass filter of claim 15 wherein each of said resistance is variable.

17. The electromechanical bandpass filter of claim 14 wherein each of said circuit means comprises a field-effect transistor.

18. The electromechanical bandpass filter of claim 14 including additional circuit means connected across the second current conducting means of at least said single resonator for varying Q of said electromechanical bandpass filter.

19. The electromechanical bandpass filter of claim 18 wherein said additional circuit means comprises a variable resistance.

20. The electromechanical bandpass filter of claim 18 wherein said additional circuit means comprises a field-effect transitor.

21. The electromechanical bandpass filter of claim 14 including a rigid walled structure, each said resonator being joined at one end thereof to a wall of said structure.

22. The electromechanical bandpass filter of claim 14 including a plurality of rigid walled structures, each said resonator being joined at one end thereof respectively to a wall of each of said structures respectively.

23. The electromechanical bandpass filter of claim 18 including a rigid walled structure, each said resonator being joined at one end thereof to a wall of said structure.

24. The electromechanical bandpass filter of claim 18 including a plurality of rigid walled structures, each said resonator being joined at one end thereof respectively to a wall of each of said structures respectively.

References Cited

UNITED STATES PATENTS

| | | | |
|---|---|---|---|
| 3,413,573 | 11/1968 | Nathanson et al. | 332—31 |
| 3,295,064 | 12/1966 | White | 328—58 |
| 3,200,354 | 8/1965 | White | 333—30 |
| 3,283,271 | 11/1966 | Persson | 333—71 |
| 2,898,477 | 8/1959 | Hoestery | 307—88.5 |
| 2,866,014 | 12/1958 | Burns | 179—110 |
| 2,553,491 | 5/1951 | Shockley | 171—330 |

HERMAN K. SAALBACH, Primary Examiner

C. BARAFF, Assistant Examiner

U.S. Cl. X.R.

333—72; 317—235; 332—31; 179—110; 334—40.